(12) United States Patent
Avci et al.

(10) Patent No.: US 10,193,507 B1
(45) Date of Patent: Jan. 29, 2019

(54) CURRENT SWITCHING CIRCUIT

(71) Applicant: Analog Devices Global, Hamilton (BM)

(72) Inventors: Celal Avci, Istanbul (TR); Bilal Tarik Cavus, Istanbul (TR)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/665,010

(22) Filed: Jul. 31, 2017

(51) Int. Cl.
*H03F 3/45* (2006.01)
*H03F 1/32* (2006.01)
*H01L 27/08* (2006.01)
*H03D 7/16* (2006.01)
*H03F 1/48* (2006.01)
*H03G 1/00* (2006.01)
*H03L 1/02* (2006.01)
*H03D 7/18* (2006.01)

(52) U.S. Cl.
CPC ............ *H03F 1/3211* (2013.01); *H01L 27/08* (2013.01); *H03D 7/161* (2013.01); *H03D 7/18* (2013.01); *H03F 1/483* (2013.01); *H03G 1/0029* (2013.01); *H03L 1/023* (2013.01)

(58) Field of Classification Search
CPC ........................................................ H03F 3/45
USPC ........................................ 330/254, 261, 252
See application file for complete search history.

(56) References Cited

U.S. PATENT DOCUMENTS

| | | | |
|---|---|---|---|
| 4,429,270 A | 1/1984 | Davies et al. | |
| 4,721,866 A | 1/1988 | Chi et al. | |
| 4,841,222 A | 6/1989 | Koch | |
| 5,182,756 A | 1/1993 | Waki et al. | |
| 5,633,611 A | 5/1997 | Kohno et al. | |
| 6,031,477 A | 2/2000 | Mercer | |
| 6,054,874 A | 4/2000 | Sculley et al. | |
| 6,359,511 B1* | 3/2002 | Phanse | H03F 1/301 330/254 |
| 7,259,628 B2* | 8/2007 | Huang | H03F 3/45183 330/254 |
| 8,767,756 B2 | 7/2014 | Black et al. | |
| 8,798,091 B2 | 8/2014 | Black et al. | |
| 9,450,540 B2* | 9/2016 | Li | H03F 3/4565 |
| 2008/0284488 A1* | 11/2008 | Sanduleanu | H03D 7/1425 327/356 |
| 2010/0102870 A1 | 4/2010 | Seedher et al. | |
| 2010/0164595 A1* | 7/2010 | Radice | H03D 7/1433 327/356 |

FOREIGN PATENT DOCUMENTS

EP   0 443 238   8/1991

* cited by examiner

*Primary Examiner* — Henry Choe
(74) *Attorney, Agent, or Firm* — Knobbe, Martens, Olson & Bear, LLP

(57) ABSTRACT

A wide range differential current switching circuit can operate across a wide range of input currents and across a broad range of frequencies. A first differential current source can include a first transistor and a second transistor. The first transistor receives a switching signal and provides an output current and at output node. The second transistor receives an inverted switching signal, the first transistor and the second transistor coupled to each other at a tail node. A current source provides an input current to the tail node. A third transistor can provide a boost current to the tail node while the first transistor is off.

20 Claims, 13 Drawing Sheets

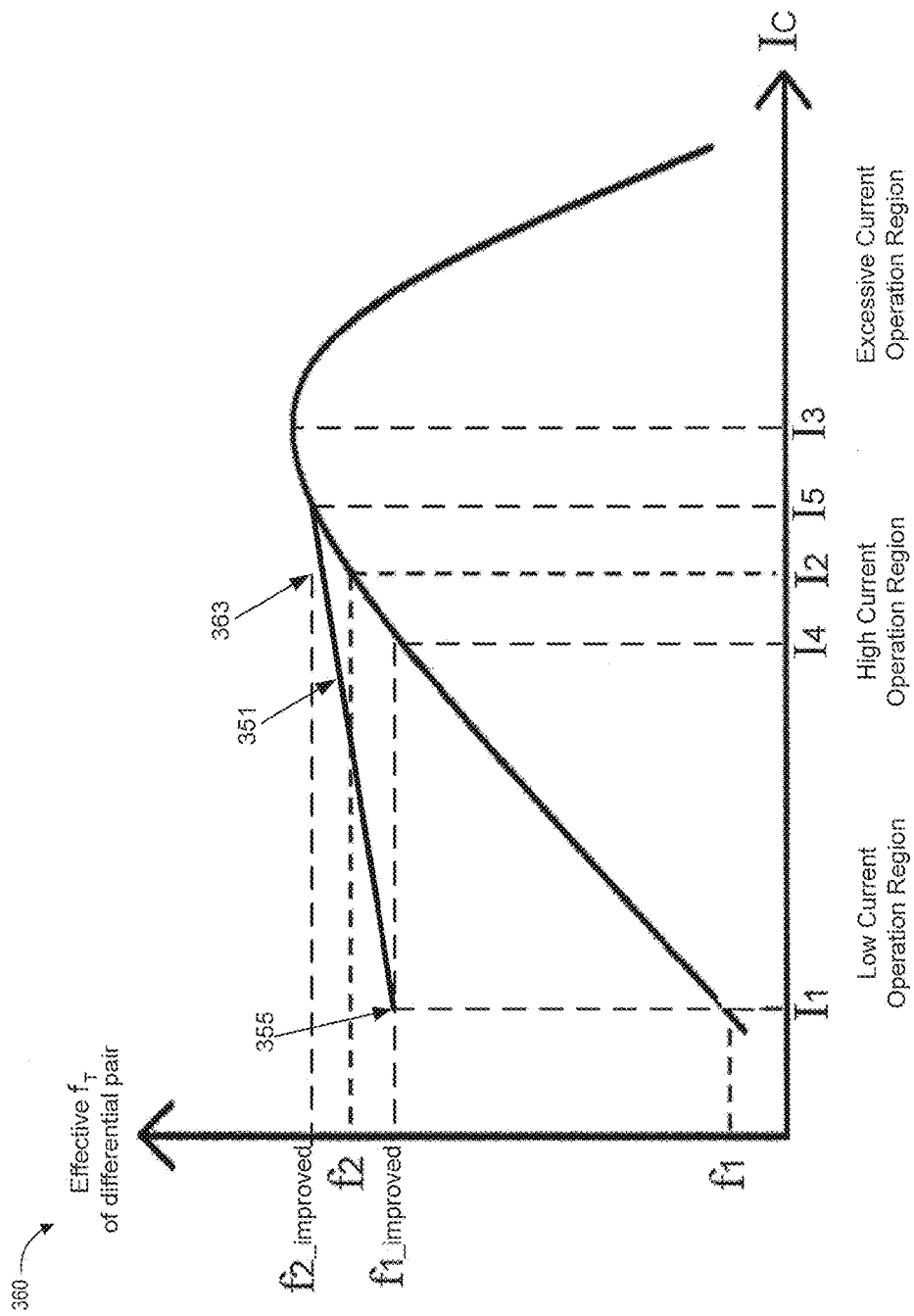

CURRENT SWITCHING CIRCUIT

FIELD

This disclosure relates to current switching circuits and applications thereof.

BACKGROUND

A current switching circuit can generate current pulses at an output node. Such a current switching circuit can include a differential pair of transistors. The performance of the differential transistors may change based on the current provided to the differential transistors and/or the switching frequencies of the differential transistors. This can limit the performance of a current switching circuit.

SUMMARY OF THE DISCLOSURE

One aspect of this disclosure is a current switching circuit comprising: a differential current switching circuit and a third transistor configured to provide a boost current to the tail node while the first transistor is off. The differential current switching circuit includes: a first transistor configured to receive a switching signal and to provide an output current to an output node; a second transistor configured to receive an inverted switching signal, the first transistor and the second transistor coupled to each other at a tail node; and a first current source configured to provide an input current to the tail node.

The current switching circuit can include any combination of the following features. The current switching circuit of claim 1, further includes: a second current source configured to generate the boost current; and a fourth transistor; wherein the third transistor, the fourth transistor, and the second current source are arranged as a second differential current switching circuit; and wherein the third transistor is configured to receive an inverted boost switching signal and the fourth transistor is configured to receive a boost switching signal. The third transistor is configured to receive an inverted boost switching signal that has substantially a same period as the switching signal. The inverted boost switching signal has a different duty cycle than the switching signal such that the third transistor turns off before the first transistor turns on to prevent the boost current from flowing to the output node. Each of the first transistor, the second transistor, and the third transistor is a bipolar junction transistor; the collector of the first transistor is coupled to the output node; and an emitter of the first transistor and an emitter of the second transistor are coupled to the tail node. The third transistor is configured to provide the boost current to the tail node while the second transistor is on and to cease providing the boost current to the tail node prior to the second transistor turning off. A second current source is configured to provide the boost current that is comparable to a maximum current level of the input current. The first transistor and the second transistor are respectively sized such that the first transistor can operate at the first transistor's maximum frequency when biased with a first current and the second transistor can operate the second transistor's maximum frequency when biased with a second current that is greater than the first current. The first transistor and the second transistor are arranged as a differential pair, and wherein the second transistor and the third transistor are configured as a cascode. The second transistor is biased with the boost current such that the second transistor switches faster than the first transistor and, due to both the first transistor and the second transistor coupled to each other at a tail node, the second transistor forces the first transistor to switch faster than the first transistor can switch without the presence of the second transistor.

Another aspect features a current switching circuit for providing an output current at an output node, the current switching circuit comprising: a first differential current switching circuit comprising a first current source and configured to alternate between passing an input current through a first transistor and through a second transistor, wherein the first transistor is configured to provide the output current; and a second differential current switching circuit comprising a second current source and configured to alternate between passing a boost current through a third transistor and through a fourth transistor, wherein the second differential current circuit is configured to bias the second transistor by passing the boost current through the third transistor while the input current is being passed through the second transistor.

The current switching circuit can include any combination of the following features. A main switching signal provided to the first differential current switching circuit has substantially a same period as a boost switching signal provided to the second differential current switching circuit. A duty cycle of the boost switching signal is different than a duty cycle of the main switching signal. The first transistor, the second transistor, the third transistor, and the fourth transistor are bipolar transistors. The current switching circuit is configured to isolate the boost current from the output node. The output current is configured to emulate the output current of a photodiode.

Another aspect features a method of providing an output current at an output node, the method comprising: alternatingly causing an input current to flow through a first transistor and a second transistor, the first transistor and the second transistor arranged as a differential pair of transistors coupled together at a tail node, and the first transistor configured to provide the output current to the output node; and providing a boost current to the tail node while the input current is flowing through the second transistor.

The method can include any combination of the following features. The boost current is provided for a subset of time that widens a range of currents passed through the first transistor to the output node across while the input current is switched at a frequency. The method further includes providing the output current to a digital to analog converter (DAC) circuit. The method further includes amplifying the output current with an operational amplifier.

For purposes of providing a summary, certain aspects, advantages, and novel features of the innovations have been described herein. It is to be understood that not necessarily all such advantages can be achieved in accordance with any particular embodiment. Thus, the innovations described herein can be embodied or carried out in a manner that achieves or optimizes one advantage or group of advantages as taught herein without necessarily achieving other advantages as can be taught or suggested herein.

BRIEF DESCRIPTION OF THE DRAWINGS

FIG. 3E is a graph showing a relationship between frequency and current for an example differential current switching circuit with a wide range current switching architecture.

Figure 1:
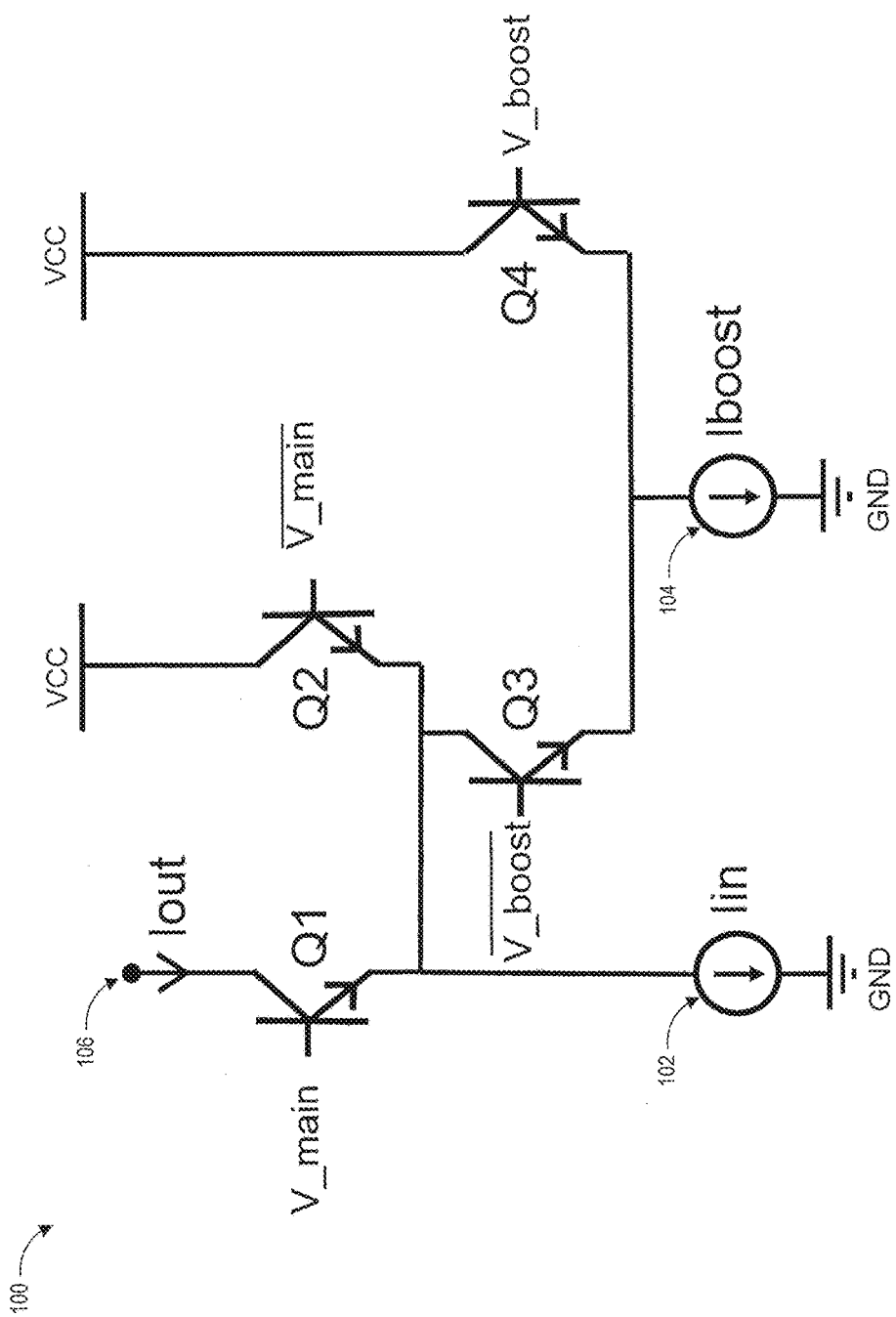
FIG. 1 is a schematic diagram of an example wide range current switching circuit that includes NPN bipolar junction transistors (BJTs) according to an embodiment.

The same labels and numbers are used throughout the different figures to indicate similar and/or same components.

DETAILED DESCRIPTION

A current switching circuit with a simple differential pair can be arranged to switch a current source to provide an output current that can be switched on and off across a range of frequencies. However, wide range current switching for broadband applications has proven to be difficult. The switched current source may not reliably operate if the frequency is too high or too low. Also, the switched current source may not reliably operate if the amount of current provided by the current source is too high or too low. A transistor designed for high frequency and high current operation in such a circuit may have a lower frequency range when biased with a low current. Without the technology disclosed herein, a current switching circuit may tradeoff current range for frequency range. For example, wide-current-range pulsed current source structures (having low current and high current capability) may be limited from generating both low frequency and high frequency current pulses. The tradeoff occurs, at least in part, because a transistor's operating frequency can degrade when the biasing current of the transistor decreases. Individual transistors can therefore limit the performance of the current switching circuit. Accordingly, such current switching circuits with a simple differential pair have not been able to acceptably switch across a broadband of frequencies and a wide range of currents.

There is a need for an improved current switching circuit that can operate over both a wide frequency range and a wide current range. Aspects of this disclosure related to a current switching circuit that provides wide range and broadband current switching.

Current switching circuits are disclosed. A current switching circuit can include a cascode circuit topology and two current sources. The current sources can include an input current source configured to provide an input current to be switched to an output node and a boost current source configured to provide a boost current. The boost current can bias transistors of the current switching circuit other than a current switching transistor configured to provide the output current at a relatively high frequency operating region. For example, the boost current can bias two transistors including a lower cascode transistor coupled to the boost current source and an upper cascode helper transistor. The upper cascode helper transistor and the current switching transistor are arranged as a differential pair. The current switching transistor can be optimized or otherwise arranged to switch a maximum input current at relatively high frequencies. The upper cascode helper transistor can be optimized or otherwise arranged to pass a combined boost current and maximum input current. The upper cascode helper transistor has a better frequency behavior and controls its emitter (or source) with a relatively fast response. This can cause the current switching transistor to work as a faster device over its emitter (or source), so that even under conditions of switching a low input current to an output, the current switching transistor is capable of switching relatively high frequencies while biased with the low current. Accordingly, current switching circuits discussed herein can switch wide range current for broadband applications.

Example Wide Range Current Switching Circuit

FIG. 1 is a schematic diagram of an example wide range current switching circuit 100 that includes NPN bipolar junction transistors (BJTs). The NPN BJTs include transistors Q1, Q2, Q3, and Q4. The illustrated current switching circuit 100 also includes a main current source 102, a boost current source 104, and output node 106.

Transistor Q1 has a collector coupled to the output node 106. Transistor Q1 has an emitter coupled to the main current source 102, the emitter of transistor Q2, and the collector of transistor Q3. A main switching signal V_main is applied to the base of Q1. In FIG. 1, the main switching signal V_main is a voltage signal.

Transistor Q2 has a collector coupled to a supply voltage VCC. Transistor Q2 has an emitter coupled to the main current source 102, the emitter of transistor Q1, and the collector of transistor Q3. As shown in FIG. 1, the transistors Q1 and Q2 are arranged as a differential pair coupled together at a tail node. The input current Iin can be referred to as a tail current since it is provided to the tail node. The illustrated transistors Q1 and Q2 are bipolar transistors with respective emitters coupled to the tail node. An inverted main switching signal, shown in FIG. 1 as $\overline{\text{V\_main}}$, is provided to the base of transistor Q2. In FIG. 1, the inverted main switching signal $\overline{\text{V\_main}}$ is a voltage signal that is the logical compliment of the main voltage signal V_main.

Transistor Q3 has a collector coupled to the emitter of transistor Q1, the emitter of transistor Q2, and the main current source 102. The emitter of transistor Q3 is coupled to the emitter of transistor Q4 and also coupled to the boost current source 104. An inverted boost switching signal, shown in FIG. 1 as $\overline{\text{V\_boost}}$, is provided to the base of transistor Q3. The transistors Q2 and Q3 are arranged in a cascode circuit topology.

Transistor Q4 has a collector coupled to the supply voltage VCC. Transistor Q4 has an emitter coupled to the emitter of transistor Q3 and to the boost current source 104.

The boost switching signal V_boost is provided to the base of transistor Q4. As shown in FIG. 1, the transistors Q3 and Q4 are arranged as a second differential pair coupled together at a second tail node.

The main current source 102 provides an input current Iin. One side of the main current source 102 is coupled to a ground reference GND. Another side of the main current source is coupled to the emitter of transistor Q1, the emitter of transistor Q2, and the collector of transistor Q3. In some embodiments, the main current source 102 can be a variable current source. For example, the main current source 102 can be a constant current source, an adjustable current source, etc. In some embodiments, the main current source 102 can provide a range of currents from a minimum input current Imin to a maximum input current Imax.

The boost current source 104 provides a boost current Iboost. One side of the boost current source 104 is coupled to the ground reference GND. Another side of the boost current source 104 is coupled to the emitters of transistors Q3 and Q4. The amount of current provided by boost current source 104 can be about the same as a maximum current provided by the main current source 102. In some embodiments, the boost current source 104 can be configured to provide a current that is at least the same as or greater than the maximum current output provided by the main current source 102. In some embodiments, the boost current source 104 can be configured to provide a current that is at least 50%, 75%, or 90% of the maximum current provided by the main current source 102. In some embodiments, the boost current source 104 can be configured to provide a current that is within an order of magnitude of the maximum current provided by the main current source 102.

In FIG. 1, the switching circuit 100 is arranged such that the boost current Iboost remains isolated from the output node 106. The boost current Iboost can be, at various times of a cycle, diverted through transistors Q2, Q3, Q4, but without being diverted through transistor Q1 during the cycle.

During a first state, the boost current Iboost current can flow through transistors Q3 and Q2, while input current Iin flows through transistor Q2. During a second state, the boost current Iboost can flow through transistor Q4, while the input current Iin flows through transistor Q1 to the output node 106.

Even when the switching circuit 100 is configured to switch very low input current Iin values to the output node 106, the minimum current that flows through transistor Q2 is at least Iboost+Iin(min), which can improve the frequency behavior of transistor Q2. The maximum current that flows through transistor Q2 is Iboost+Iin(max). When the boost current Iboost is sufficiently large (e.g., at least twice as large) compared to the range that the input current Iin can vary across, the ratio of minimum to maximum currents flowing through transistor Q2 would be relatively small and have a relatively small impact on the frequency performance of transistor Q2. Accordingly, the operating frequency of transistor Q2 can degrade by significantly smaller amounts, even when the minimum and maximum input current Iin varies across a large range.

As illustrated, the output current Iout is provided at the output node 106.

In FIG. 1, transistors Q1, Q2, and the main current source 102 are arranged as a first differential current switching circuit. The main switching signal V_main applied to transistor Q1 and the inverted main switching signal $\overline{V\_main}$ applied to transistor Q2 turn the transistors Q1 and Q2 on and off such that the input current Iin supplied by the main current source 102 alternates between flowing through either transistor Q1 or transistor Q2. When the main switching signal V_main is asserted (e.g., has a logic high value in FIG. 1), the input current Iin flows through transistor Q1 to the output node 106. When the main switching signal V_main is deasserted (e.g., has a logic low value in FIG. 1), the input current Iin flows through transistor Q2 instead of flowing through Q1. In FIG. 1, transistor Q1 turns off when the main switching signal V_main signal is low, isolating the input current Iin from current source 102 from the output node 106.

Transistors Q3, Q4, and the boost current source 104 are arranged as a second differential current switching circuit. The boost signal V_boost applied to transistor Q4 and the inverted boost signal $\overline{V\_boost}$ applied to transistor Q3 turn the transistors Q3 and Q4 on and off such that the boost current Iboost supplied by the boost current source 104 alternates between flowing through either transistor Q3 or transistor Q4. When the V_boost signal is asserted (e.g., has a logic high value in FIG. 1), the boost current Iboost flows through transistor Q4. When the boost signal V_boost is deasserted (e.g., has a logic low value in FIG. 1), the boost current Iboost flows through transistor Q3.

When the boost signal V_boost is deasserted and the main switching signal V_main is low (e.g., has a logic low value in FIG. 1), the boost current Iboost flows through transistor Q3 and through transistor Q2. The input current Iin also flows through transistor Q2. Therefore, the combined current flowing through transistor Q2 is the sum of the input current Iin plus the boost current Iboost. The transistor Q2 can be sized to operate across a wide band of frequencies when the combination of the input current Iin plus the boost current Iboost is provided to transistor Q2, even across a wide ranges of input currents In. The transistor sizing and linear response to logarithmic increases in current are illustrated and further discussed with respect to FIG. 3B, FIG. 3C, FIG. 3D, and FIG. 3E. In some embodiments, the boost current Iboost does not flow through transistor Q1, and the input current Iin does not flow through transistor Q4.

In some other embodiments, transistors Q1, Q2, Q3, and Q4 can be different types of transistors than shown in FIG. 1. For example, transistors Q1, Q2, Q3, and Q4 can be PNP bipolar transistors, field effect transistors (FETs) such as n-type FETs (NFETs) and/or p-type FETs (PFETs), or any suitable combination thereof.

The emitters (or sources) of Q1 and Q2 can be coupled to the main current source 102. The emitters (or sources) of Q3 and Q4 can be coupled to the boost current source 104. NPN and NFET based architectures include sink type tail currents. PNP and PFET based architectures include source type tail currents. A tail current can be provided to a tail that that is coupled to, for example, emitters of bipolar transistors or sources of FETs.

Figure 2:
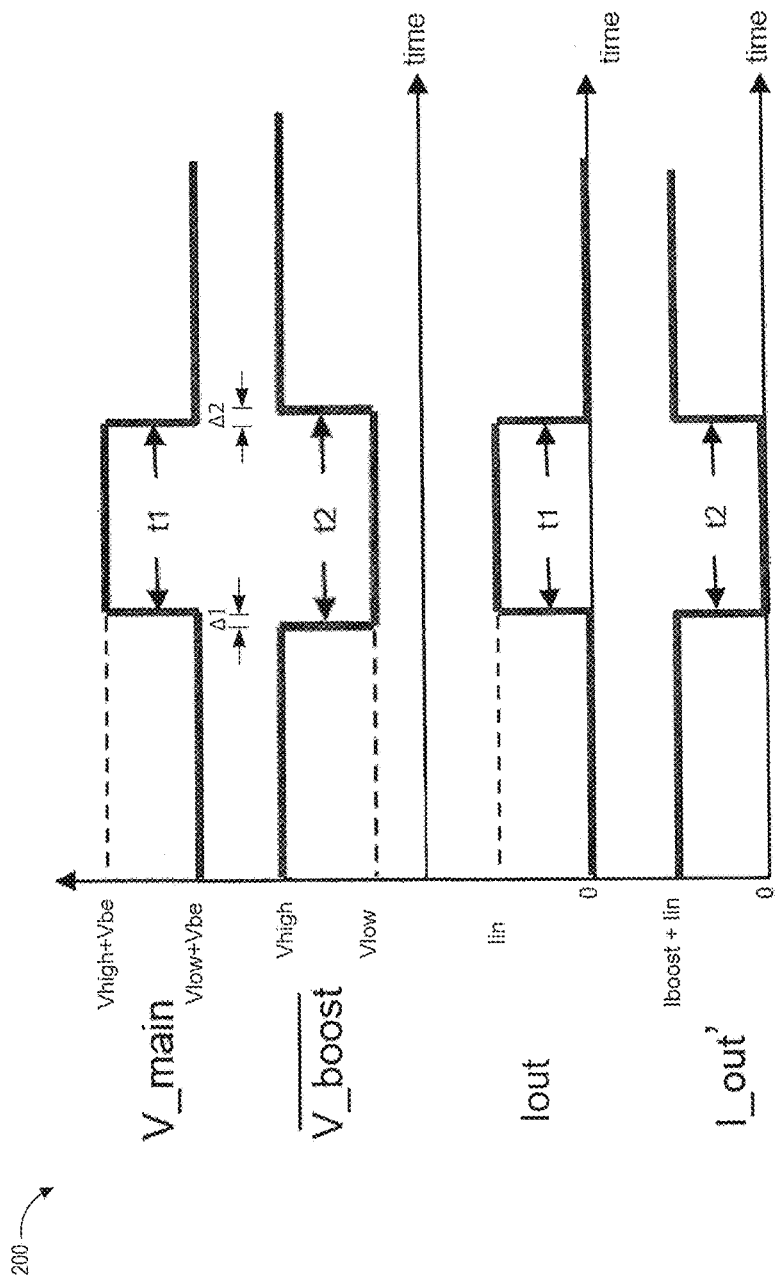
FIG. 2 shows an example control and output timing diagram for the wide range current switching circuit of FIG. 1.

FIG. 2 shows an example control and output timing diagram 200 for the wide range current switching circuit 100 shown in FIG. 1. The timings are discussed with reference to both FIG. 1 and FIG. 2.

As shown in FIG. 2, the output current Iout (taken at node 106 in FIG. 1) corresponds to the input current Iin through transistor Q1 when the main switching signal V_main turns on transistor Q1 (e.g., Vhigh+Vbe, in which Vhigh corresponds to logic high voltage and Vbe corresponds to a base-to-emitter voltage of transistor Q1). The output current Iout is approximately zero when the main voltage signal V_main turns off transistor Q1. An inverted V_main signal (not shown in FIG. 2) can be provided to Q2 to turn Q2 on and off at opposite times from Q1. As discussed above, when the main voltage signal V_main is low and $\overline{\text{V\_main}}$ is high, the input current Iin will be directed through Q2 instead of through Q1. In FIG. 2, I_out' represents the current flowing through transistor Q2. As shown in FIG. 2, the sum of the boost current Iboost and the input current Iin can flow through Q2 while only the input current Iin can flow through transistor Q1.

The inverted boost signal $\overline{\text{V\_boost}}$ is provided to Q3 and switches between a value that causes transistor Q3 to turn on (e.g., Vhigh) and a value that causes transistor Q3 to turn off (e.g., Vlow). The V_boost signal (not shown in FIG. 2) can be provided to Q4 to turn Q4 on and off at opposite times from Q3.

The main switching signal V_main and boost signal V_boost (and/or their respective complements) can be in phase. Furthermore, the main switching signal V_main and boost signal V_boost (and/or their respective complements) can have substantially the same period. In some embodiments where glitches are not problematic, V_main and V_boost can be the same signal.

In some embodiments, there can be a difference in the duty cycles of the main switching signal V_main and the boost signal V_boost such that the main switching signal V_main and the boost signal V_boost are non-overlapping clock signals. The main switching signal V_main and boost signal V_boost can be similar or same. In some embodiments, the ON time t2 for the boost signal V_boost can be slightly longer than the ON time t1 for the main switching signal V_main. The main switching signal V_main can have a difference between logical high and logic low values that is greater than the boost switching signal V_boost.

During a switching cycle, the boost signal V_boost can be asserted slightly before the corresponding assertion of the main switching signal V_main. The inverted boost signal $\overline{\text{V\_boost}}$ can be deasserted before the main switching signal V_main is asserted. The boost signal V_boost can additionally or alternatively be deasserted slightly after the corresponding change in the main switching signal V_main. The differences and order of timing can help prevent certain glitches in the output current Iout.

As shown in the timing diagram 200, the main switching signal V_main is similar to the boost signal V_boost except for differences during small periods of time $\Delta 1$ and $\Delta 2$. For example, in some embodiments the $\Delta 1$ and $\Delta 2$ timings can be in the range of about 5-10 picoseconds when the circuit is switched at about 8 GHz. In some embodiments, the $\Delta 1$ and $\Delta 2$ timings can be different values for switching at the same and/or different frequencies. The timing differences can help prevent certain glitches in the output current.

Transistor Characteristics

It can be desirable for a current switching circuit to provide a desired output current Iout across a wide range of frequencies at which the main switching signal V_main is switched.

Figure 3A:
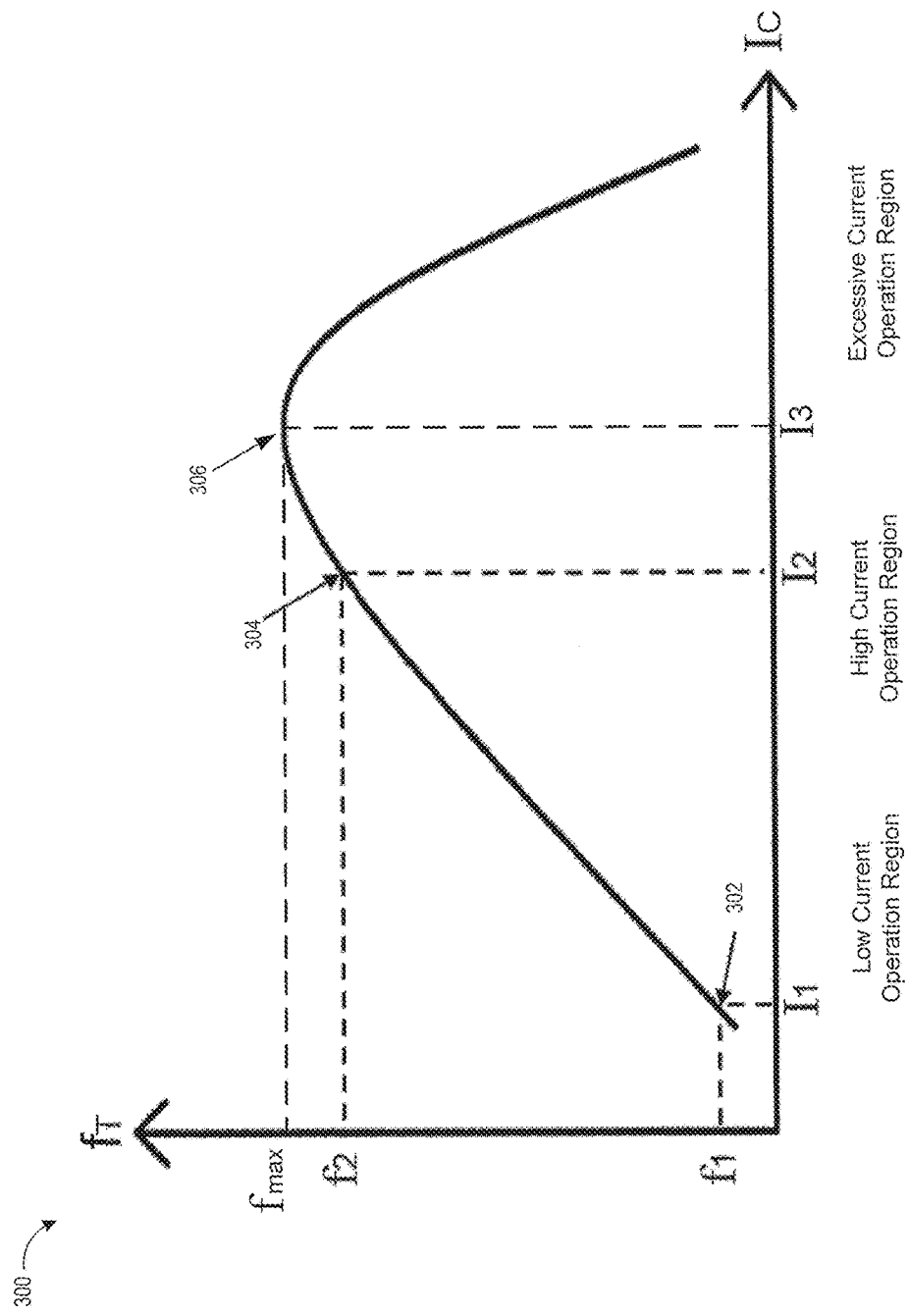
FIG. 3A is an example graph showing a relationship between frequency and current for an example NPN bipolar junction transistor of a fixed size.

FIG. 3A is an example graph 300 showing a relationship between frequency and current for an example NPN bipolar junction transistor of a fixed size. The y-axis indicates a maximum switching frequency $f_T$ for which a transistor (e.g., Q1 of FIG. 1) can reliably turn on and off in response to a switching signal (e.g., V_main). The x-axis indicates, on a log scale, a current Ic that biases the transistor being switched. Although FIG. 3A is used to provide an example of a maximum operating frequency $f_T$ and input bias current Ic relationship for a transistor, the concepts discussed herein can be extended to describe the relationship between an effective maximum operating frequency $f_T$ of a differential pair and a current Ic provided to the differential pair with transistors of the same type and size. The effective $f_T$/Ic curve of a differential pair with differently sized transistors can have performance characteristics bounded by the $f_T$/Ic characteristics of the individual transistors that make up the differential pair.

The low current operation region includes a range of currents (such as around $I_1$) where the maximum switching frequency is relatively low (e.g., around f1), and the maximum reliable frequency increases with current Ic. The high current operation region includes a range of currents (such as around $I_2$) up through I3 where the maximum switching frequency is relatively high. The I3 value indicates an current Ic value for which a transistor can operate at a maximum reliable frequency fmax. The excessive current operating region beyond I3 is where the maximum reliable frequency decreases with increasing current Ic. When the current Ic exceeds I3, the frequency can degrade too quickly to provide reliable operation for some applications.

A transistor can be sized (e.g., as discussed with respect to FIG. 3B) and constructed to have the properties shown by a particular $f_T$/Ic curve, such as shown in FIG. 3A. However, for a $f_T$/Ic curve associated with a particular sizing, the maximum switching frequency is relatively low (e.g., at f1) when the current is low (e.g., at I1). An individual differential switching circuit (e.g., without the second differential pair of transistors Q3 and Q4, or boost current Iboost shown in FIG. 1) can have an effective $f_T$/Ic curve where the effective maximum switching frequency $f_T$ is similarly low (e.g., at f1) when the input current to the differential pair is low (e.g., at I1).

A differential current switching circuit can be configured to provide a range of current output values, such as from $I_1$ to $I_2$, based on the properties of the transistors included in the differential current switching circuit. The range from $I_1$ to $I_2$ can be easier to implement and control in comparison to higher ranges such as I3 and beyond, and the increase in the maximum frequency $f_T$ is substantially linear when viewed on a log scale. Also, the range from $I_1$ to $I_2$ provides a buffer for an additional amount of current Ic past $I_2$ before higher order effects begin to dominate around I3 and beyond. Circuits configured for operating in other ranges, such as up to I3 or beyond, are possible but more difficult to implement and control.

A differential current switching circuit can also be switched at varying frequencies, such as from f1 to f2, based on the properties of the transistors included in the differential current switching circuit. The range from f1 to f2 can be easier to implement. However, the differential current switching circuit could be switched at frequencies up through fmax.

Graph 300 can correspond to, for example, transistor Q1 of FIG. 1. The current Ic can correspond to the input current Iin from the main current source 102. The maximum switching frequency $f_T$ can correspond to the maximum switching frequency for which Q1 could reliably operate Graph 300 can also correspond to, for example, transistor Q2 of FIG. 1. For example, the maximum frequency $f_T$ that transistor Q2 could reliably switch is based on current Ic.

The graph 300 shows that, for a given transistor, the maximum reliable switching speed depends, at least partially, on the current through the transistor. For example, in FIG. 1, the transistor Q1 receives the input current Iin from the main current source 102. Accordingly, the maximum reliable switching speed for transistor Q1 is based on the value of the input current Iin. For example, if the transistor Q1 receives an current Ic=$I_2$, then the maximum speed at which transistor Q1 can be reliably switched is f2. However, as the current Ic provided to Q1 is decreased (e.g., from $I_2$ to $I_1$), then the maximum reliable switching speed will decrease until a relatively low value (e.g., f1).

Therefore, a BJT transistor such as Q1 can operate with a wide frequency range (e.g., up through about f2) for a limited range of current values (e.g., Ic is in the range of $I_2$). Alternatively, the BJT transistor Q1 could operate across a wide range of currents (e.g., from $I_1$ through $I_2$), but the maximum reliable switching frequency would be limited (e.g., to about f1) while operating in a low current operation region (e.g., around $I_1$). Some designs of current switching circuits are limited by the performance characteristics of the transistors in the current switching circuit, and either the maximum switching frequency performance or the range of current values is limited.

It can be desirable to have a differential current switching circuit reliably operate across a wide range of current values while being switched across a high frequency range. The example wide range current switching circuits disclosed herein (e.g., in FIG. 1, FIG. 6, FIG. 7, FIG. 8A-8C) can provide improved frequency performance (e.g., as shown in FIG. 3C) across a wide of currents as compared to the performance shown in FIG. 3A.

Transistor Sizing

Figure 3B:
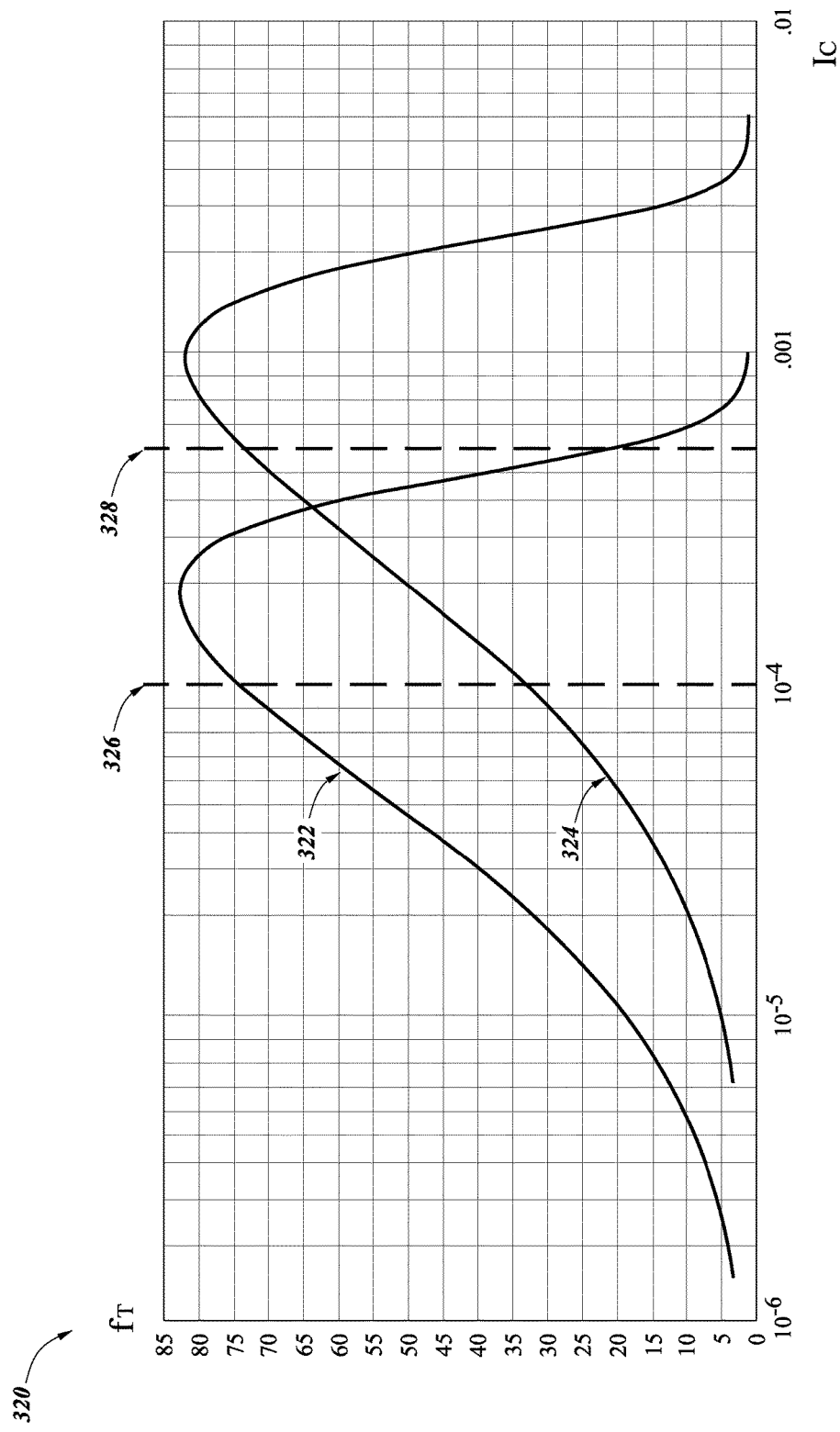
FIG. 3B is a graph showing frequency and current characteristics of example transistors of different sizes.
Figure 3C:
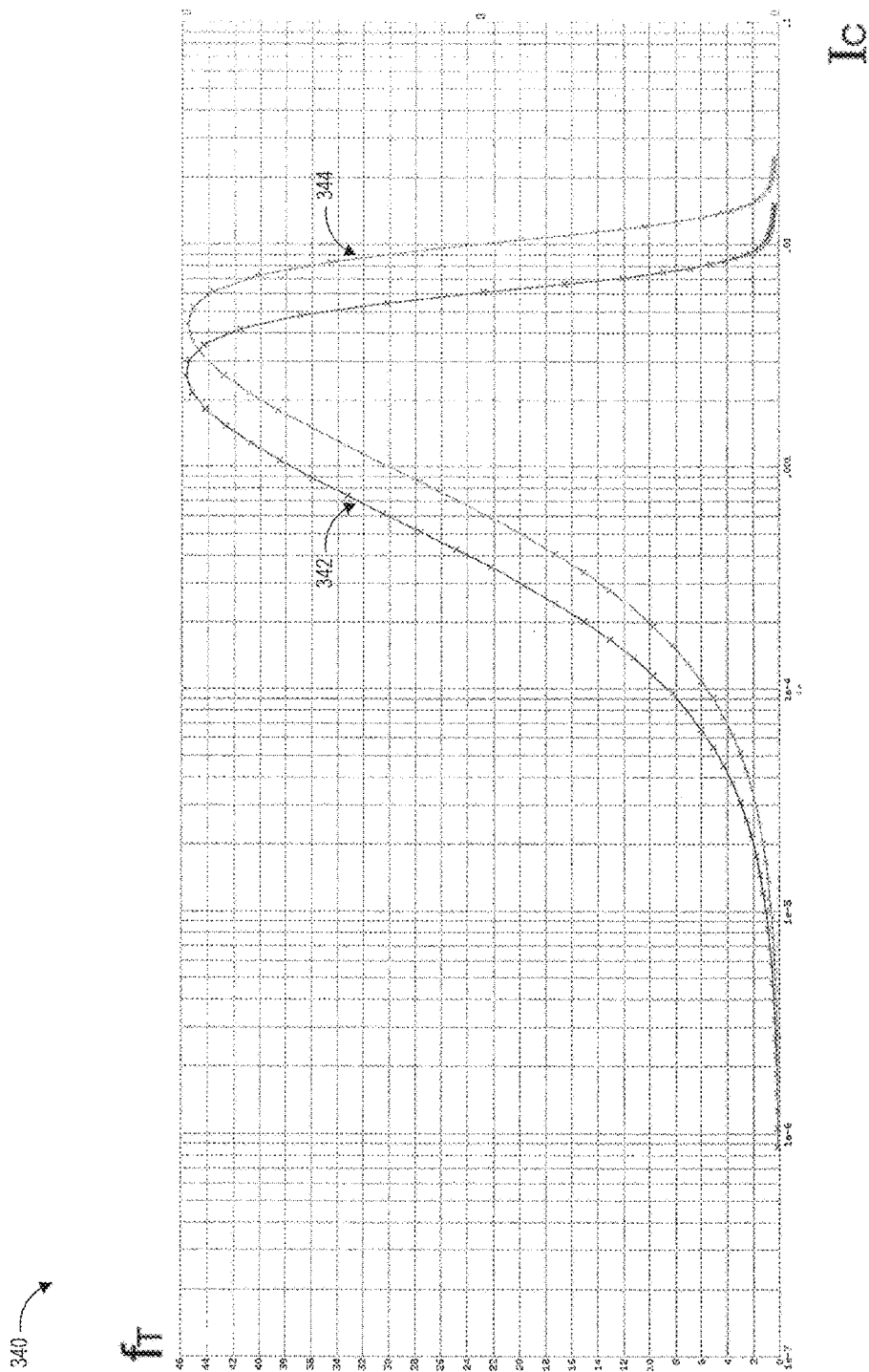
FIG. 3C is a graph showing frequency and current characteristics of example transistors of different sizes.

FIG. 3B is a graph 320 showing frequency and current characteristics of example transistors of different sizes. The y-axis indicates a maximum switching frequency fT in GHz for which a transistor (e.g., Q1) can reliably turn on and off in response to a switching signal (e.g., V_main). The x-axis indicates, along a log scale, a current Ic in Amperes (Amps) that biases the transistor being switched. Curve 322 shows a maximum switching frequency fT and current Ic relationship for a smaller sized transistor. Curve 324 shows a maximum switching frequency fT and current Ic relationship for a larger sized transistor. Although FIG. 3B is discussed with respect to individual transistors, the concepts and relationships shown in FIG. 3B are also applicable to a differential pair, where fT is the effective maximum switching frequency of the differential pair and Ic is a current provided to the differential pair.

As shown in FIG. 3B, the maximum switching frequency and current relationship curve 324 for the larger sized transistor is shifted to the right as compared to the maximum switching frequency and current relationship curve 322 for the smaller sized transistor. The maximum switching frequency and current relationship curve 322 is left shifted compared to the maximum switching frequency and current relationship curve 324. Sizing transistors can cause curves (e.g., curves 322 and 324) to have other small variations besides the mathematical shift/translation. The transistors can be sized in order to improve the relative frequency performance for particular current Ic.

For example, at the Ic=$1e^{-4}$ Amps indicated by dotted line 326, the curve 322 for the smaller sized transistor has a switching frequency fT around 75 GHz, while the larger transistor has a switching frequency fT around 33 GHz. The smaller transistor is sized for better switching performance at lower currents (e.g., Ic=$1e^{-4}$ Amps) than the larger transistor.

However, the larger transistor is sized for better performance at other frequencies. For example, at the Ic=$5e^{-4}$ Amps indicated by dotted line 328, the curve 324 for the larger sized transistor has a switching frequency fT around 73 GHz, while the smaller transistor has a switching frequency fT around 22 GHz. Furthermore, the smaller transistor reaches the excessive current operation region at a lower Ic such that $5e^{-4}$ Amps would be included in the excessive current operation of the smaller transistor. The larger transistor is sized for better switching performance at higher currents (e.g., Ic=$5e^{-4}$ Amps) than the smaller transistor.

Although an example graph 320 is shown in FIG. 3B, the maximum switching frequency for which a transistor can reliably turn on and off in response to a switching signal may change differently for different types and/or doping polarities of transistors.

Transistors of different sizes can be used to improve the operation of differential current switching circuits across a wide range of current values while being switched across a high frequency range. For example, with respect to FIG. 1, transistors Q1 and Q2 can be different sizes. In some embodiments, transistor Q2 can be sized for better performance at higher currents than Q1. In embodiments implementing both transistor Q1 and Q2 as NPN BJTs, transistor Q2 can be a larger sized transistor than transistor Q1. In some embodiments where main current source 102 generates a variable input current Iin, transistor Q1 can be sized such that transistor Q1 can switch at a faster frequency than transistor Q2 when Iin is a first, lower value. In some embodiments where main current source 102 generates a variable input current Iin, transistor Q2 can be sized such that transistor Q2 can switch at a faster frequency than transistor Q1 when input current Iin is a second, higher value. In some embodiments, transistors Q1 and Q2 can be the same size.

FIG. 3C is a graph 340 showing frequency and current characteristics of example transistors of different sizes. FIG. 3C provides another example of the effects of sizing transistors as discussed above with respect to FIG. 3B. Curves 342 and 344 illustrate the fT/Ic curves for transistors of different sizes. The fT/Ic curves 342 and 344 peak at different current Ic values compared to the fT/Ic curves 322 and 324 as shown in FIG. 3B. As shown by FIGS. 3B and 3C, transistors can have a variety of sizes and operate across a different current ranges.

Effect of Boost Current on Switching Frequencies

The second differential current switching circuit in FIG. 1 can help the wide range current switching circuit 100 to reliably operate across both a wide range of frequencies and a wide range of currents. In FIG. 1, the second differential current switching circuit includes transistor Q3, transistor Q4, and the boost current source 104. Transistor Q3 is coupled to transistor Q2 so that the boost current can be provided through transistor Q3 and through transistor Q2 when V_main is low and V_boost is low.

The boost current source 104 is configured to provide a current Ic (such as current $I_2$ as shown in FIG. 3A) to transistors Q3 and Q4 such that transistor Q3 and transistor Q4 operate in the high current operation region. Relative to the main current source 102, the boost current source 104 can provide a current that is the same as or similar to a maximum current Imax provided by the main current source 102. In some embodiments, the boost current source 104 is configured to provide a substantially constant current. The boost current Iboost can be larger or smaller than Imax.

In some embodiments, the Iboost current can vary to counterbalance variations in the input current Iin, such that Iin+Iboost=Iconstant. Transistor Q2 can be sized to optimize switching when biased with Iconstant, or at least operate in the high current operation region with a relatively high maximum switching frequency when biased with Iconstant.

Transistors Q3 and Q4 can be sized to achieve a high maximum switching frequency when the Iboost current is switched between transistors Q3 and Q4. This can include making transistors Q3 and Q4 the same or similar sizes to each other. This can also include, for example, sizing transistors Q3 and Q4 such that transistors Q3 and Q4 are biased in the high current operation region when provided with a current Ic that is based on the boost current Iboost and can switch at a high maximum switching frequency or a highest maximum switching frequency.

Transistor Q2 can be sized to switch across a range of frequencies when provided with currents ranging from about Iboost to about Imax+Iboost. In an embodiment where Iboost is about equal to Imax, the range is from about Imax to 2*Imax. In some embodiments, transistor Q2 is sized to operate in a high current operation region when Ic=Imax such that transistor Q2 has a high maximum switching frequency. Transistor Q2 can also be sized such that transistor Q2 also operates in the high current operation region and does not enter the excessive current operation region when Ic=Iin+Iboost. In some embodiments, transistor Q2 is optimized for switching at higher frequencies based on the total tail current value of transistor Q2.

In some embodiments, a boost current Iboost is provided to transistor Q2 while an input current Iin ranges from a minimum of I1 to a maximum of I2. The range of currents provided to transistor Q2 can be from Iboost+I1 to Iboost+I2. If Iboost is significantly larger than the range that the input current Iin varies across, then the operating frequency of transistor Q2 does not degrade much because the change as a total percentage of bias current will be significantly smaller. Because the Ic axis on the fT/Ic curve has a logarithmic current Ic axis, there can be a small change or degradation in fT, even as Iin changes across the entire range from I1 to I2. Accordingly, for a diff pair including boosted transistor Q2 along with a transistor Q1, the effective maximum operating frequency fT can be still relatively high. Through tied emitters, transistor Q2 can force transistor Q1 to switch faster.

When the main switching signal V_main and the boost signal V_boost are deasserted, the amount of current conducted through transistor Q2 can vary along with variations with the input current Iin. If the input current Iin can range from Imin to Imax, and the boost current Iboost is about the same as Imax, then transistor Q2 can be expected to conduct an amount of current between Imax and 2*Imax. Therefore, transistor Q2 can be sized to switch at high or highest frequencies when the current Ic is based on an amount between Imax through 2*Imax, inclusive.

In some embodiments, transistor Q1 can be sized to operate across a wider range of frequencies than transistor Q2. Transistor Q1 can be sized to operate when the current Ic is based on the input current Iin, which varies from Imin to Imax. For example, transistor Q1 can be sized such that the low current and high current operation regions include Imin through Imax. In some embodiments, transistor Q1 is sized for switching at high frequencies in response to the main current source providing Iin=Imax.

Transistor Q1 can operate across a wide range of currents Ic as shown on the log scale in FIG. 3A, and the maximum switching speed of transistor Q1 can vary between relatively faster and slower switching speeds. Transistor Q2 can be sized to switch quickly across a relatively small range of currents Ic as shown on the log scale in FIG. 3A. Therefore, transistor Q2 can switch quickly, even when the input current Iin is relatively low (e.g., closer to Imin than Imax). Transistor Q2 has a better frequency behavior than transistor Q1 when the input current Iin is relatively low. However, the emitter of transistor Q1 is coupled to the emitter of transistor Q2. For BJTs, the switching speed is related to a base-to-emitter voltage (Vbe) of the BJT. When transistor Q2 switches, it changes the Vbe quickly. Transistor Q2's emitter voltage will be shared by the emitter of transistor Q1, forcing transistor Q1 to also switch. Therefore, when transistor Q2 switches at a faster frequency, transistor Q2 can pull or force transistor Q1 to switch faster than transistor Q1 could otherwise switch without the voltage effect of transistor Q2. In some other embodiments featuring different types of transistors, the tails of transistors Q1 and Q2 are coupled to share a common voltage such that transistor Q2 pulls, forces, or otherwise causes transistor Q1 to switch at a faster speed than transistor Q1 could otherwise switch without the voltage effect of transistor Q2, even across a wide range of input currents Iin.

Figure 3D:
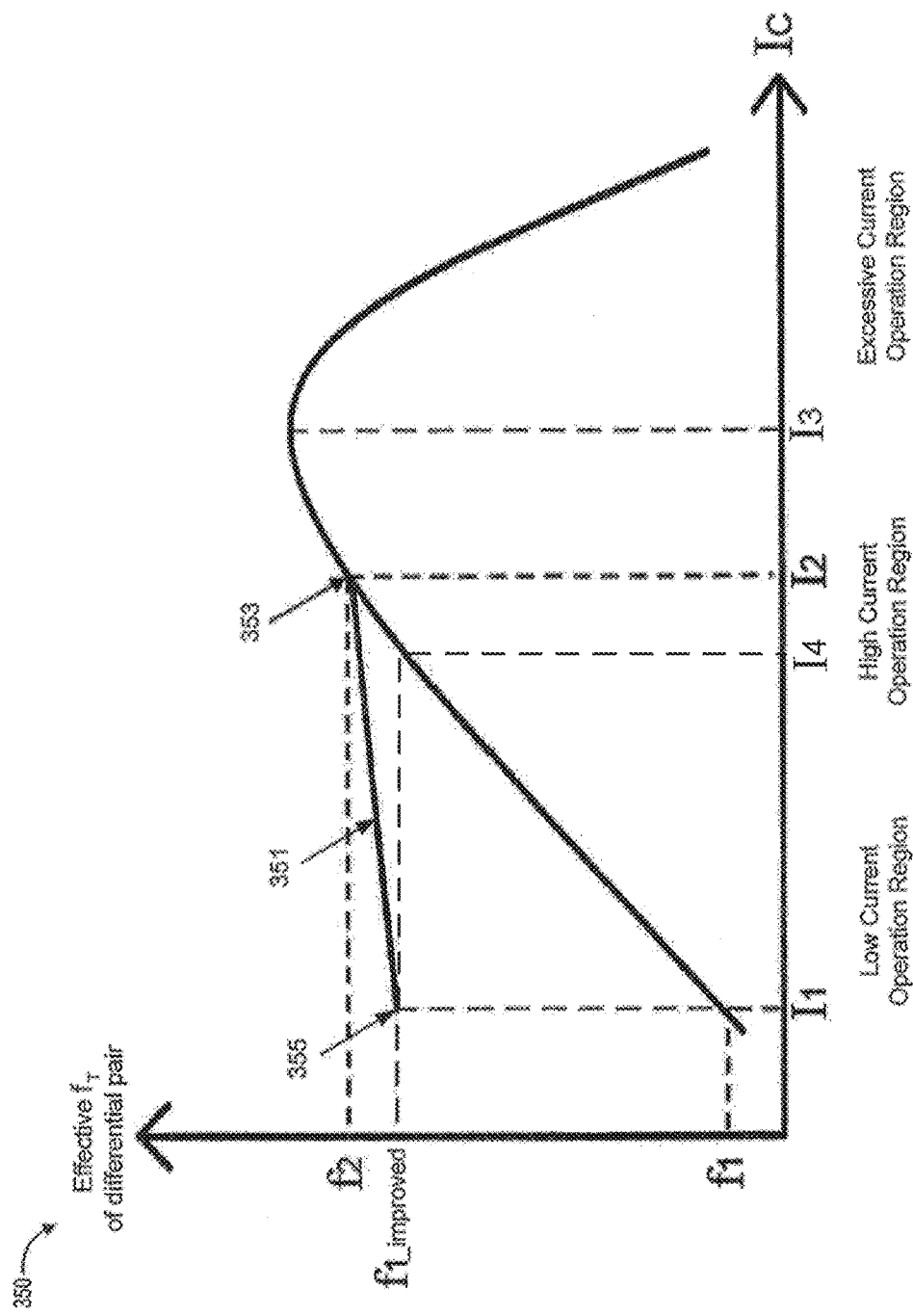
FIG. 3D is a graph showing a relationship between frequency and current for an example differential current switching circuit with a wide range current switching architecture.

FIG. 3D is a graph 350 showing an approximate relationship between frequency and current for an example differential current switching circuit with a wide range current switching architecture. The y-axis indicates a maximum effective switching frequency fT for which a differential current switching circuit (e.g., as shown in FIG. 1) can operate in response to a switching signal (e.g., V_main). The x-axis indicates, on a log scale, a current Ic that biases the transistors (e.g., Q1 or Q2 in FIG. 1) in the differential current switching circuit. In the example embodiment shown in FIG. 3D, the wide range current switching architecture is configured such that a value of Iboost plus a minimum operational value of Iin~=I4, and a value of Iboost+a maximum operational value of Iin~=I2.

The curve 351 indicates the maximum effective switching frequency that the differential current switching circuit can operate at across a range of current Ic values. At relatively low currents Ic, curve 351 indicates higher maximum effective switching frequencies than the maximum reliable switching frequency of the individual transistors that make up the differential current switching circuit. In other words, the differential current switching circuit can switch faster than its individual transistors could independently switch.

At $I_2$, point 353 indicates that the highest effective operating frequency is about f2. However, as the Ic decreases toward $I_1$, the curve 351 does not drop off as steeply. At $I_1$, the highest maximum effective operating frequency is f1_improved, which is higher than f1. Accordingly, even at I1, the curve 351 indicates a wide band of frequencies (e.g., up to about f1_improved).

Across the wide range from $I_1$ to $I_2$, the differential current switching circuit with a wide range current switching architecture can be switch maximum effective operating frequencies from f1_improved to f2. Accordingly, the wide band of frequencies can be maintained across a wide range of currents (across I1 to I2).

FIG. 3E is a graph 360 showing an approximate relationship between frequency and current for an example differential current switching circuit with a wide range current switching architecture. The y-axis indicates a maximum effective switching frequency fT for which a differential current switching circuit (e.g., as shown in FIG. 1) can operate in response to a switching signal (e.g., V_main). The x-axis indicates, on a log scale, an current Ic that biases the transistors (e.g., Q1 or Q2 in FIG. 1) in the differential current switching circuit.

In the example embodiment shown in FIG. 3E, the wide range current switching architecture is configured such that a value of Iboost+a minimum operational value of Iin~=I4, and a value of Iboost+a maximum operational value of Iin~=I5.

At $I_2$, point 363 indicates that the highest effective operating frequency is about f2_improved. However, as the Ic decreases toward $I_1$, the curve 351 does not drop off as steeply. At I₁, the highest maximum effective operating frequency is f1_improved, which is higher than f1. Accordingly, even at I1, the curve 351 indicates a wide band of frequencies (e.g., up to about f1_improved).

It should be recognized that the graphs shown in FIG. 3D and FIG. 3E can be approximations of the performance characteristics of a differential pair. Because a boost current can be applied to one transistor (e.g., transistor Q2) of the differential pair while the other transistor (e.g., transistor Q1) of the differential pair is configured differently, the performance of one transistor may affect the other transistor such that an intermediate performance results. Nonetheless, FIG. 3D and FIG. 3E still provide examples of the general principles and teachings discussed herein.

Example Performance Data

Figure 4:
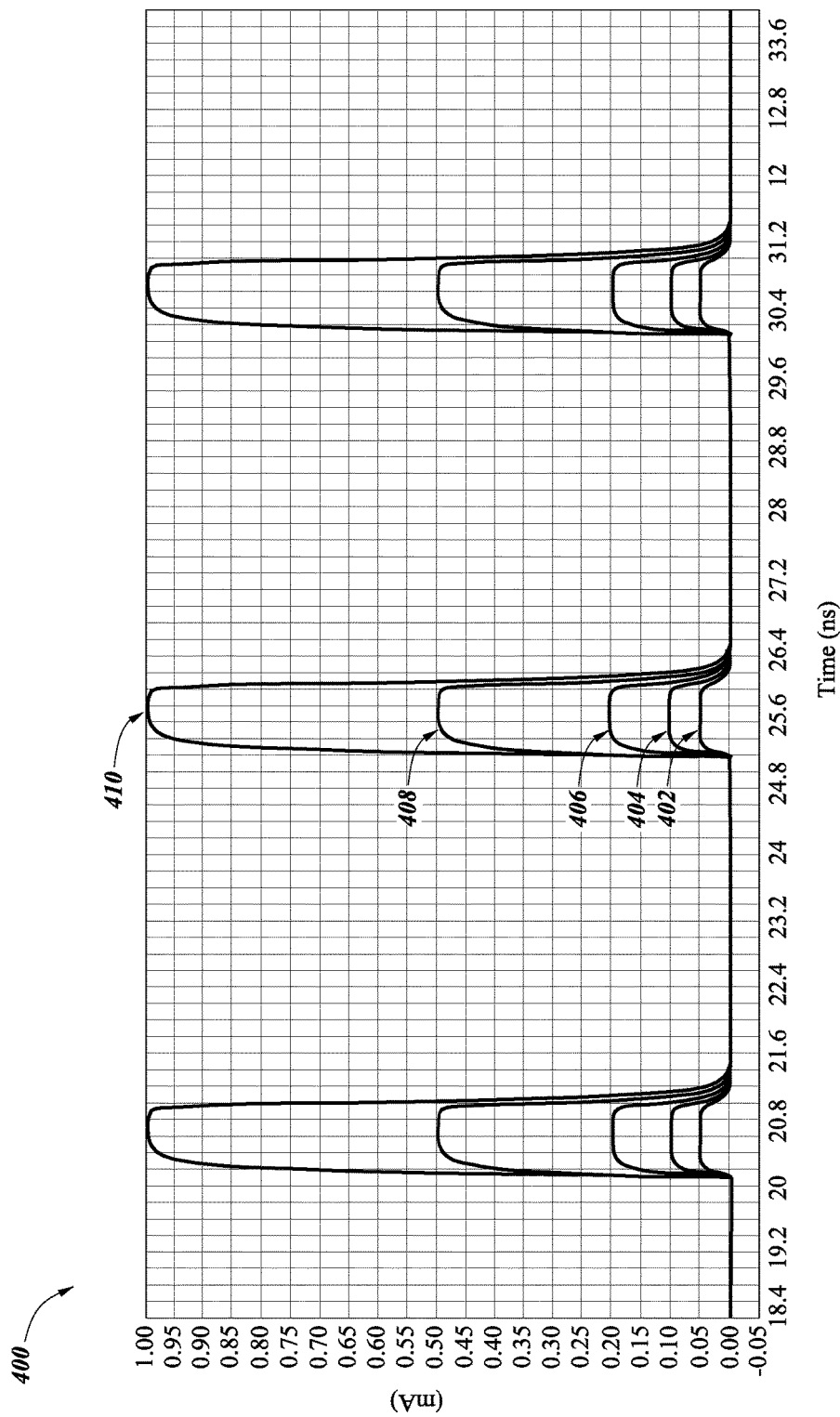
FIG. 4 is a graph showing a current output of an example wide range current switching circuit in response to a pulse for a range of currents.

FIG. 4 is a graph 400 showing a current output of an example wide range current switching circuit in response to a pulse for a range of currents. The y-axis shows the current output (e.g., Iout of FIG. 1) in milliamps. The x-axis shows time in nanoseconds. The curves 402, 404, 406, 408, and 410 indicate the outputs when the input current (e.g., Iin of FIG. 1) of the example wide range current switching circuit is set to different values between about 50 micro-amps and 1 milliamp. The example wide range current switching circuit is configured to switch on and off to provide an output pulse of about 1 nanosecond. The rise and fall times are about 125 picoseconds.

Figure 5:
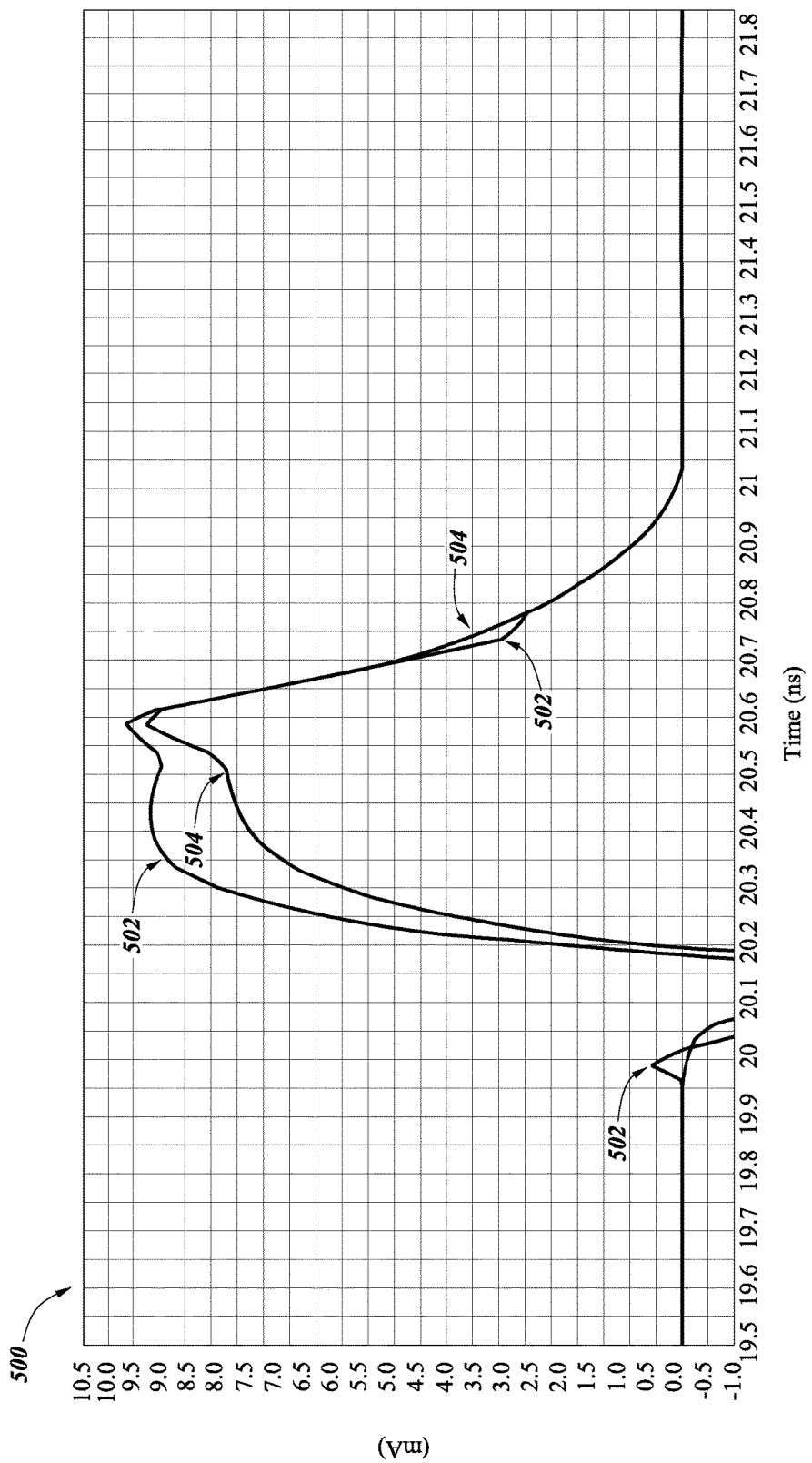
FIG. 5 is a graph showing the output currents of different current switching circuits designs.

FIG. 5 is a graph 500 showing the output currents of different current switching circuits designs. The y-axis shows the current output in milliamps. The x-axis shows time in nanoseconds.

Curve 502 indicates a current output of an example wide range current switching circuit. Curve 504 indicates a current output of a lower performance current switching circuit. Both the example wide range current switching circuit and the lower performance current switching circuit are configured to provide a 9.0 micro-amp output current. Both circuits are switched to provide an output current at about the 19.95 ns mark. The output of the example wide range current switching circuit is able to reach 9.0 micro-amps around the 20.36 ns mark, which is faster than the lower performance current switching circuit. The lower performance current switching circuit does not provide a 9.0 micro-amp output current until after about the 20.57 ns mark. The example wide range current switching circuit also provides a more stable output. The example wide range switching circuit settles faster than the lower performance current switching circuit.

Additional Example Current Switching Circuits

In addition to the example embodiment of a wide range current switching circuit shown in FIG. 1 using NPN BJTs, other embodiments of wide range current switching circuits can include other types of transistors such as, for example, PNP BJTs, FETs such as metal oxide field effect transistors (MOSFETs), other suitable semiconductor based transistors, or any suitable combination thereof. The current switching circuits can include n-type transistors, p-type transistors, or a combination of n-type transistors and p-type transistors.

Figure 6:
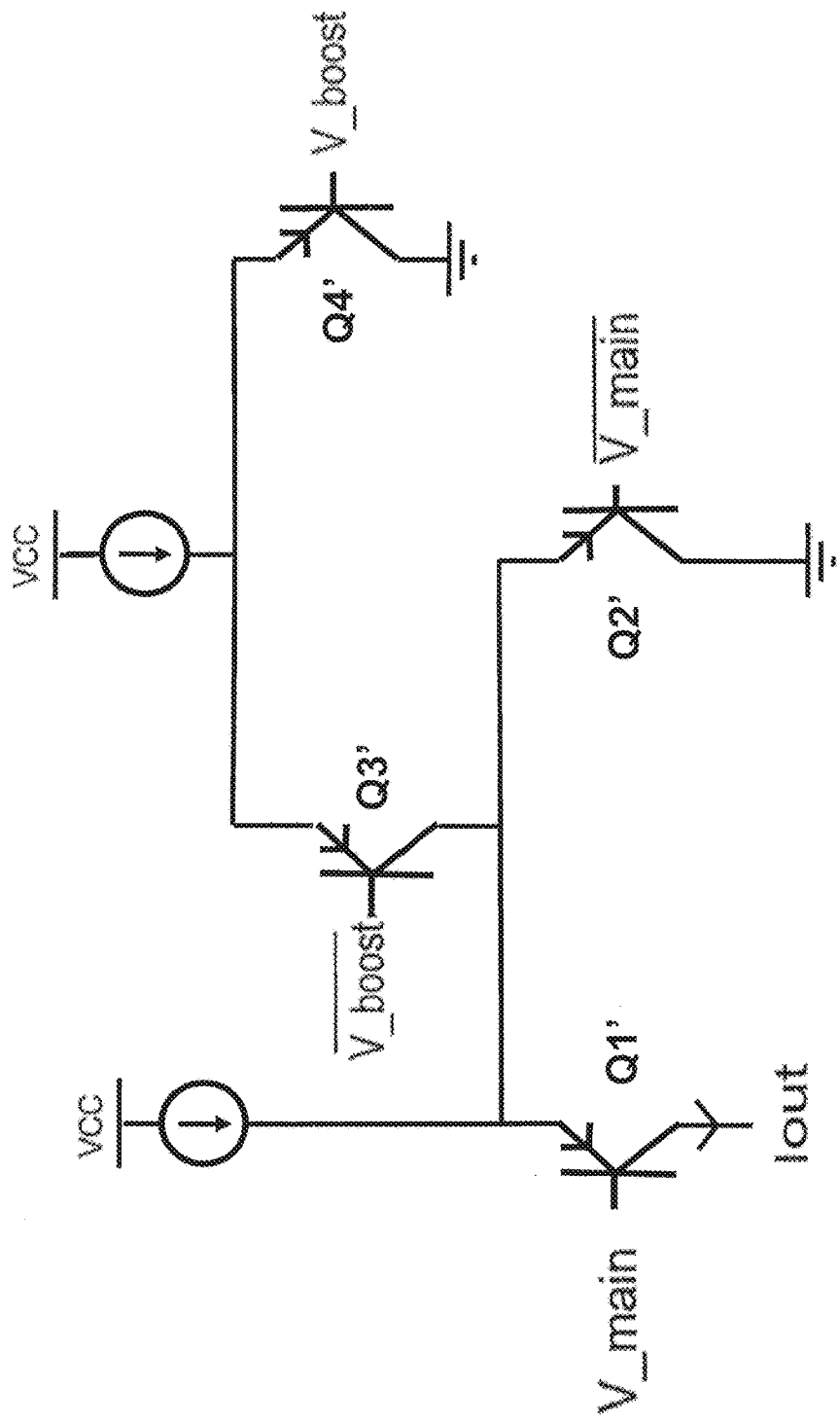
FIG. 6 is a schematic diagram of an example wide range current switching circuit that includes PNP bipolar junction transistors according to an embodiment.

FIG. 6 is a schematic diagram of an example wide range current switching circuit 600 that includes PNP bipolar junction transistors. Transistors Q1', Q2', Q3', and Q4' are implemented as PNP bipolar junction transistors. The current switching circuit 600 is functionally similarly to circuit 100 of FIG. 1 but uses a different transistor type and is appropriately flipped based on the different transistor type. In other embodiments, the PNP bipolar junction transistors can be implemented as PFETs, PMOS transistors, or other semiconductor devices.

Figure 7:
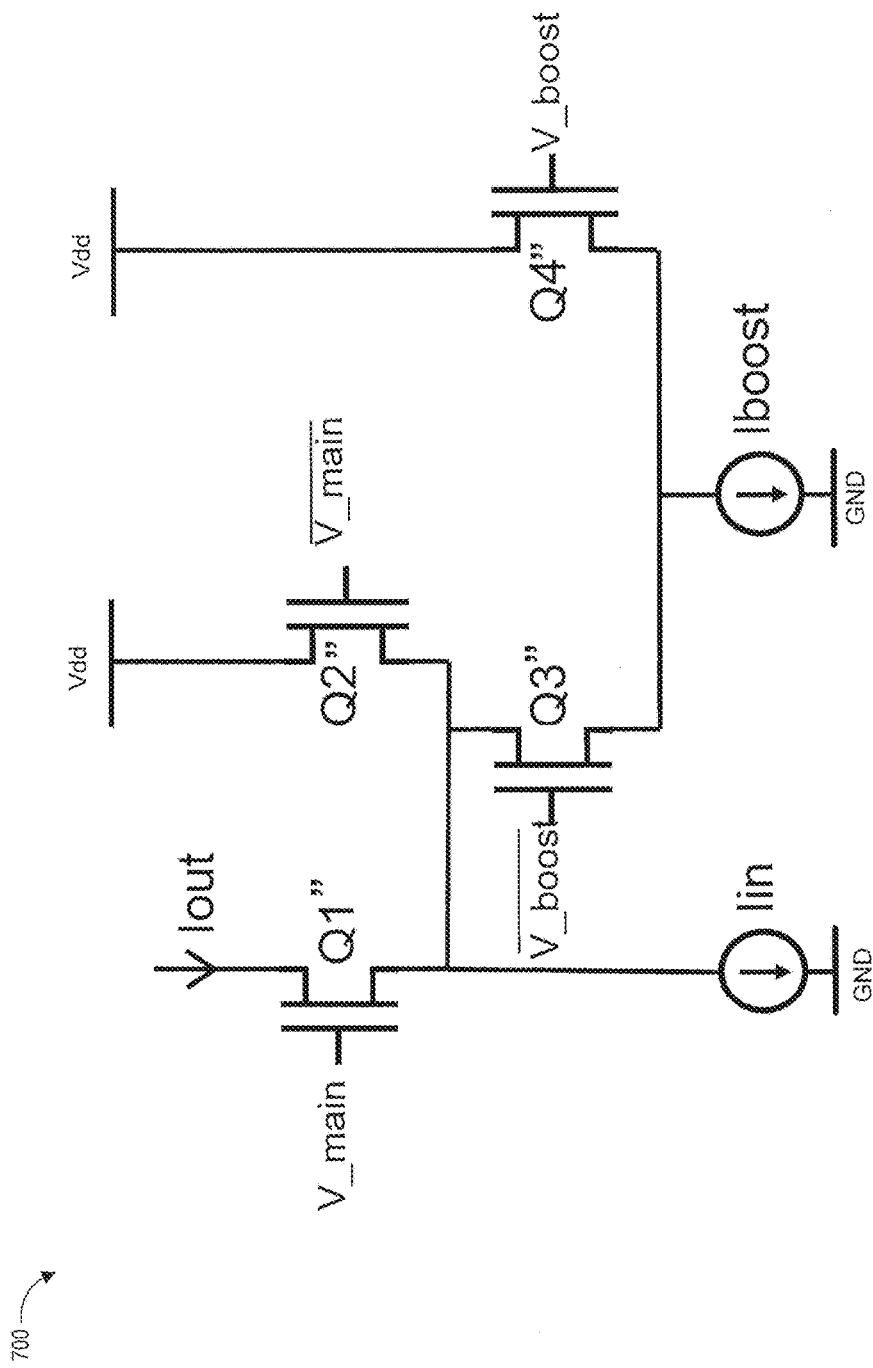
FIG. 7 is a schematic diagram of an example wide range current switching circuit that includes field effect transistors according to an embodiment.

FIG. 7 is a schematic diagram of an example wide range current switching circuit 700 that includes field effect transistors. Transistors Q1", Q2", Q3", and Q4" are implemented as NFETs, such as n-type MOSFETs. A supply voltage is provided at Vdd, and GND is a ground reference. The current switching circuit 700 can behave similarly to circuit 100 of FIG. 1. In some other embodiments, the transistors can be implemented as PFETs, and the power rails can be flipped.

In embodiments that include various transistor types, the voltage references and/or input polarities of control signals can be flipped based on the transistor type. A change in the operational characteristics of an NPN BJT transistor was discussed with respect to FIG. 3B. Other transistors may have similar changes in operational characteristics, although such changes may occur for different reasons. Some transistors of other doping polarity and/or other types may have opposite changes operational characteristics as compared to NPN BJTs in accordance with any suitable principles or advantages discussed herein.

Example Applications

Figure 8A:
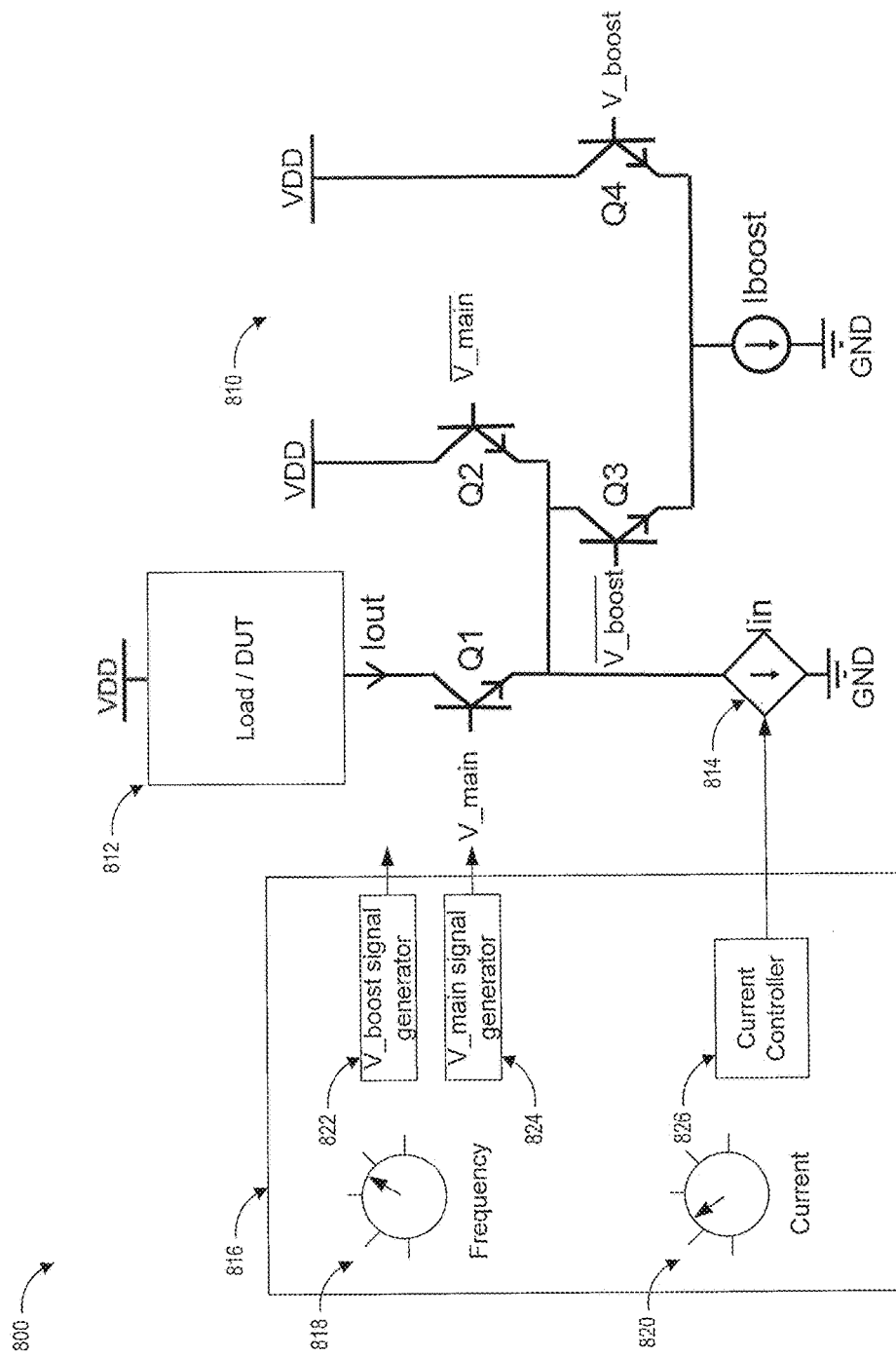
FIG. 8A is a schematic diagram of an example system that includes a wide range current switching circuit providing an output current to a load or device under test according to an embodiment.

FIG. 8A is a schematic diagram of a system 800 that includes a wide range current switching circuit 810 configured to provide an output current Iout to a load or device under test 812. The circuit 810 is similar to the wide range current switching circuit 100 of FIG. 1 with the main current source 104 implemented by a controlled current source 814. A controller 816 provides one or more user input devices such as knob 818 and knob 820 to control the frequency of the main switching signal V_main and the input current Iin, respectively.

The controller 816 includes a main signal generator 824 that generates the main switching signal V_main and its inverse based, at least in part, on a frequency selected using the knob 818. The controller 806 also includes a boost signal generator 822 that generates the boost signal V_boost and its inverse based, at least in part, on the frequency selected using the knob 818. As discussed, the V_main and V_boost signals can have slightly different duty cycles. The controller 816 also includes a current controller 826 that can be used to set the input current provided by the controlled current source 814.

Although the user input devices are shown as knobs, other embodiments can include any other suitable type of input device. For example, the controller 816 can be a computer, any device having controller, etc., and the input devices can include a mouse, keyboard, touchscreen, microphone, etc. that receive user inputs through an interface in order to cause specially configured hardware to generate the main switching signal V_main, boost signal V_boost, and current source control signals. In some embodiments, the frequency and/or current can be programmed ahead of time to be set at different values at different times and/or sweep across values. Using the setup shown in FIG. 8A, a user can control a wide range of currents and frequencies supplied to a load or device under test 812.

In some embodiments, the boost current source Iboost is a variable current source, the current controller 826 can also be configured to change Iboost such that Iboost+Iin=Iconstant. In some embodiments, the wide range current switching circuit can be used as an avalanche photodiode emulator and/or a photodiode emulator.

A load or device under test 812 can include, for example, a digital signal processor, a current detector, a coulomb counter, an analog to digital converter, a digital to analog (DAC) converter, etc. In some embodiments, the wide range current switching circuit is arranged as part of a transimpedance amplifier as shown in FIG. 8B, and the load or device under test 812 is coupled at the output of the transimpedance amplifier.

Figure 8B:
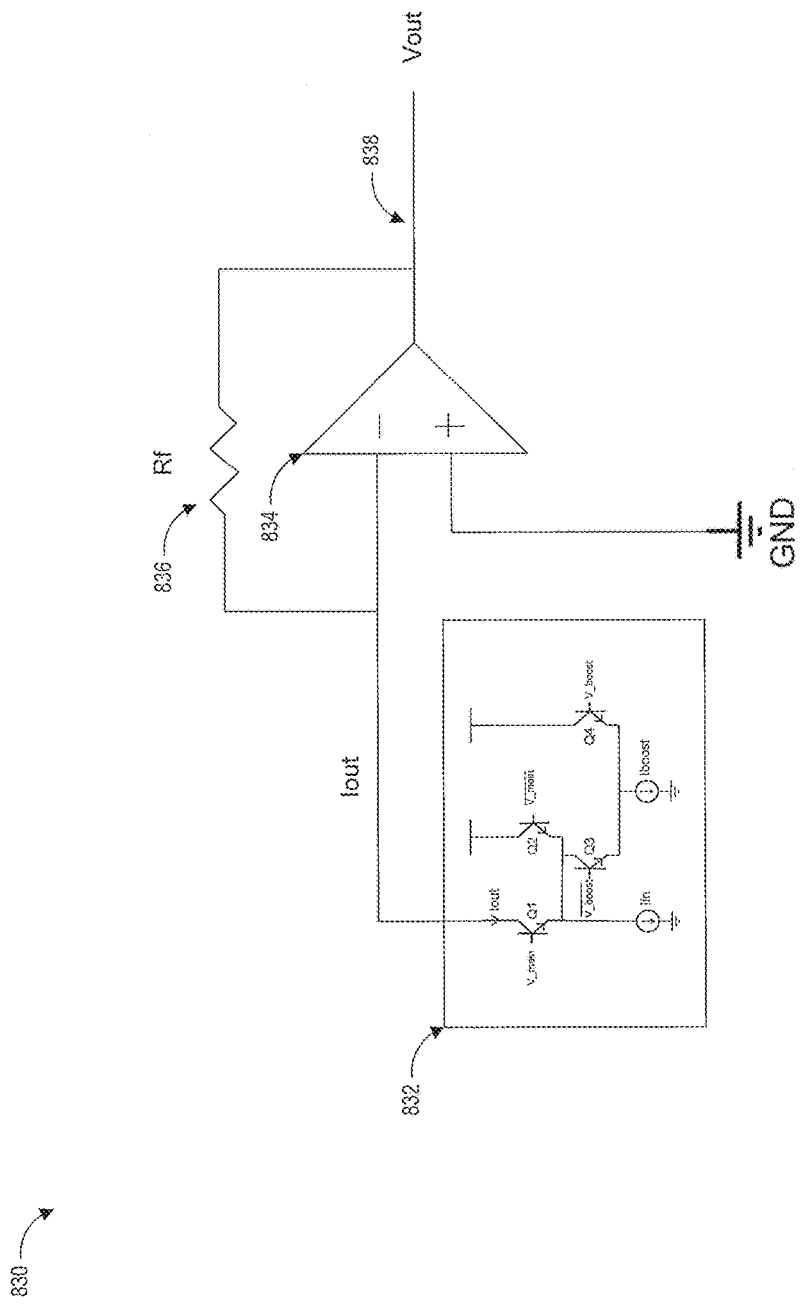
FIG. 8B shows an example diagram of a transimpedance amplifier according to an embodiment.

FIG. 8B is a schematic diagram of an example transimpedance amplifier 830. The illustrated transimpedance amplifier 830 includes a wide range current switching circuit 832, an operational amplifier (op amp) 834, and feedback resistor 836. The wide range current switching circuit 832 provides the output current Iout to the inverting input of the op amp 834. The non-inverting input of the op amp 834 can be coupled to a ground reference GND. An output voltage Vout can be provided at an output node 838 of the op amp 834. The feedback resistor 836 can be coupled between the inverting input of the op amp 834 and the output node 838.

In some applications, a wide range current switching circuit can be used as part of an digital to analog converter. In some applications, a wide range current switching circuit can be used as part of a current source circuit in a DAC. The wide range current switching circuit can also be used, for example, as part of a fiber channel arbitrated loop bufferless switch circuit. The wide range current switching circuit can also be used in any pulsed current source or current switching circuit.

Example Methods

An example method can include alternatingly causing an input current to flow through a first transistor and a second transistor, the first transistor and the second transistor arranged as a differential pair of transistors coupled together at a tail node, and the first transistor configured to provide the output current to the output node. The method can also include providing a boost current to the tail node while the input current is flowing through the second transistor.

In some embodiments, the boost current is provided for a subset of time that widens a range of currents passed through the first transistor to the output node across while the input current is switched at a frequency. In some embodiments, the method can further include generating the input current with a photodiode. In some embodiments, the method can further include amplifying the output current with an operational amplifier.

Terminology, Applications, and Additional Embodiments

The detailed description of certain embodiments herein presents various descriptions of specific embodiments. However, the innovations described herein can be embodied in a multitude of different ways, for example, as defined and covered by the claims. In the above description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and do not necessarily affect the scope or meaning of the claims.

The various features and processes described above may be implemented independently of one another, or may be combined in various ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Various embodiments can apply different techniques for making different types of electronic devices. Some embodiments apply operating, making, and/or using switching architectures and/or differential current switching circuits.

In the embodiments described above, apparatuses, systems, and methods for current switching are described in connection with particular embodiments. It will be understood, however, that the principles and advantages of the embodiments can be used for any other systems, apparatus, or methods that could benefit from current switching. Although certain embodiments are described with reference to particular types of transistors, it will be understood that the principles and advantages described herein can be applied to a variety of applications using different types of transistors and/or switches. Although certain embodiments are described with reference to a differential current switching circuit includes a current source and two transistors, other designs for differential current switching circuits can similarly benefit from the technology disclosed herein. Moreover, while some circuit schematics are provided for illustrative purposes, other equivalent circuits can alternatively be implemented to achieve the functionality described herein.

The principles and advantages described herein can be implemented in various apparatuses. Examples of such apparatuses can include, but are not limited to, vehicles, motors, treadmills, flywheels, GPS systems, gates, population counters, consumer electronic products, parts of the consumer electronic products, electronic test equipment, etc. Consumer electronic products can include, but are not limited to, wireless devices, a mobile phone (for example, a smart phone), healthcare monitoring devices, vehicular electronics systems such as automotive electronics systems, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, a radio, a camcorder, a camera, a digital camera, a washer, a dryer, a washer/dryer, a copier, a facsimile machine, a scanner, a multi-functional peripheral device, a wrist watch, a clock, etc. Further, apparatuses can include unfinished products. The technology disclosed herein can also be applied to any type of current sources, including variable current sources, voltage controlled current sources, photodiodes, programmable current sources, etc.

Unless the context clearly requires otherwise, throughout the description and the claims, the words "comprise," "comprising," "include," "including," and the like are to be construed in an inclusive sense, as opposed to an exclusive or exhaustive sense; that is to say, the words should be construed in the sense of "including, but not limited to." The words "coupled" or "connected", as generally used herein, refer to two or more elements that can be either directly connected, or connected by way of one or more intermediate elements. Additionally, the words "herein," "above," "below," and words of similar import, if and when used in this application, shall refer to this application as a whole and not to any particular portions of this application. Where the context permits, words in the Detailed Description using the singular or plural number can also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein can be embodied in a variety of other forms. Furthermore, various omissions, substitutions and changes in the form of the methods and systems described herein can be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A current switching circuit with current boosting for operation across a wider range of frequencies, the current switching circuit comprising:
    a differential current switching circuit comprising:
        a first transistor configured to receive a switching signal and to provide an output current to an output node;
        a second transistor configured to receive an inverted switching signal, the first transistor and the second transistor coupled to each other at a tail node; and
        a first current source configured to provide an input current to the tail node; and
    a third transistor coupled to the tail node, wherein the third transistor is configured to provide a boost current from a second current source to the tail node while the first transistor is off.

2. The current switching circuit of claim 1, further comprising:
    a fourth transistor;
    wherein the third transistor, the fourth transistor, and the second current source are arranged as a second differential current switching circuit; and
    wherein the third transistor is configured to receive an inverted boost switching signal and the fourth transistor is configured to receive a boost switching signal.

3. The current switching circuit of claim 1, wherein the third transistor is configured to receive an inverted boost switching signal that has substantially a same period as the switching signal.

4. The current switching circuit of claim 3, wherein the inverted boost switching signal has a different duty cycle than the switching signal such that the third transistor turns off before the first transistor turns on to prevent the boost current from flowing to the output lode.

5. The current switching circuit of claim 1, wherein:
    each of the first transistor, the second transistor, and the third transistor is a bipolar junction transistor;
    the collector of the first transistor is coupled to the output node; and
    an emitter of the first transistor and an emitter of the second transistor are coupled to the tail node.

6. The current switching circuit of claim 1, wherein during each switching period, the third transistor is configured to provide the boost current to the tail node while the second transistor is on and to cease providing the boost current to the tail node prior to the second transistor turning off.

7. The current switching circuit of claim 1, wherein the boost current is within an order of magnitude of a maximum current level of the input current.

8. The current switching circuit of claim 1, wherein the first transistor and the second transistor are respectively sized such that the first transistor can operate at the first transistor's maximum frequency when biased with a first current and the second transistor can operate the second transistor's maximum frequency when biased with a second current that is greater than the first current.

9. The current switching circuit of claim 1, wherein the first transistor and the second transistor are arranged as a differential pair, and wherein the second transistor and the third transistor are configured as a cascode.

10. The current switching circuit of claim 1, wherein the current switching circuit is configured to bias the second transistor such that the second transistor switches faster than the first transistor, and the second transistor causes a switching speed of the first transistor to be increased.

11. A current switching circuit for providing an output current at an output node, the current switching circuit comprising:
    a first differential current switching circuit comprising a first current source and configured to alternate between passing an input current through a first transistor and through a second transistor, wherein the first transistor is configured to provide the output current; and
    a second differential current switching circuit comprising a second current source and configured to alternate between passing a boost current through a third transistor and through a fourth transistor, wherein the second differential current circuit is configured to bias the second transistor by passing the boost current through the third transistor while the input current is being passed through the second transistor.

12. The current switching circuit of claim 11, wherein a main switching signal provided to the first differential current switching circuit has substantially a same period as a boost switching signal provided to the second differential current switching circuit.

13. The current switching circuit of claim 12, wherein a duty cycle of the boost switching signal is different than a duty cycle of the main switching signal.

14. The current switching circuit of claim 11, wherein the first transistor, the second transistor, the third transistor, and the fourth transistor are bipolar transistors.

15. The current switching circuit of claim 11, wherein the boost current is isolated from the output node across an entire switching period of the current switching circuit.

16. A method for increasing differential circuit switching speeds, the method comprising:
   causing an input current from a first current source of a first differential current switching circuit to switch between flowing to an output node of the first differential current switching circuit and flowing away from the output node of the first differential current switching circuit; and
   causing a boost current from a second current source of a second differential current switching circuit to switch between:
      biasing the first differential current switching circuit while the input current is flowing to first differential current switching circuit; and
      flowing away from the first differential current switching circuit;
   wherein biasing the first differential current switching circuit causes a switching speed of the first differential current switching circuit to be increased.

17. The method of claim 16, wherein the boost current is provided to bias the first differential current switching circuit for a subset of time that enables a wider a range of currents to flow to the output node while the input current is switched at a fixed frequency.

18. The method of claim 16, further comprising providing the input current through the output node to a part of a digital to analog converter (DAC) circuit.

19. The method of claim 16, further comprising providing the input current through the output node to an operational amplifier.

20. The current switching circuit of claim 11, wherein the first transistor and the second transistor are coupled to each other at a tail node, and the third transistor is coupled to the tail node.

* * * * *

UNITED STATES PATENT AND TRADEMARK OFFICE
CERTIFICATE OF CORRECTION

PATENT NO. : 10,193,507 B1
APPLICATION NO. : 15/665010
DATED : January 29, 2019
INVENTOR(S) : Celal Avci et al.

It is certified that error appears in the above-identified patent and that said Letters Patent is hereby corrected as shown below:

In the Specification

In Column 6, Line 51, change "that that" to --that--.

In Column 8, Line 55, change "operate" to --operate.--.

In Column 9, Line 20, change "FIG." to --FIGS.--.

In the Claims

In Column 18, Line 17, Claim 4, change "lode." to --node.--.

In Column 20, Line 2, Claim 16, after "to" insert --the--.

In Column 20, Line 11, Claim 17, change "a wider a range of currents" to --a wider range of currents--.

Signed and Sealed this
Thirtieth Day of April, 2019

Andrei Iancu
*Director of the United States Patent and Trademark Office*